United States Patent
Pavier

(10) Patent No.: US 8,552,543 B2
(45) Date of Patent: Oct. 8, 2013

(54) SEMICONDUCTOR PACKAGE

(75) Inventor: Mark Pavier, Felbridge (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/983,827

(22) Filed: Nov. 13, 2007

(65) Prior Publication Data

US 2008/0111232 A1 May 15, 2008

Related U.S. Application Data

(60) Provisional application No. 60/865,532, filed on Nov. 13, 2006.

(51) Int. Cl.
*H01L 23/12* (2006.01)

(52) U.S. Cl.
USPC ........... 257/678; 257/762; 257/782; 257/784; 257/786; 257/E21.514; 257/E23.026; 257/E23.124; 257/E23.179

(58) Field of Classification Search
USPC ......... 257/773, 676, 739, 667, 678, 711, 782, 257/762, 784, 786, E21.514, E23.026, 257/E23.124, E23.179, E29.12, E23.015, 257/E29.004, E29.022, E29.121

See application file for complete search history.

(56) References Cited

U.S. PATENT DOCUMENTS

| | | | | |
|---|---|---|---|---|
| 6,005,290 | A * | 12/1999 | Akram et al. | 257/723 |
| 6,104,062 | A * | 8/2000 | Zeng | 257/341 |
| 6,624,522 | B2 * | 9/2003 | Standing et al. | 257/782 |
| 2004/0169289 | A1 * | 9/2004 | Satou et al. | 257/780 |
| 2005/0023670 | A1 * | 2/2005 | Hata et al. | 257/690 |
| 2006/0049514 | A1 * | 3/2006 | Fuchs et al. | 257/713 |
| 2006/0231934 | A1 * | 10/2006 | Risaki | 257/676 |

* cited by examiner

*Primary Examiner* — Ermias Woldegeorgis
(74) *Attorney, Agent, or Firm* — Farjami & Farjami LLP

(57) ABSTRACT

A semiconductor package that includes a conductive clip having an interior surface that includes a plurality of spaced raised portions, a semiconductor device having a first major surface that includes a plurality of spaced depressions each receiving one of the raised portions in the interior thereof, and a conductive adhesive disposed between each raised portion and a respective interior surface of a depression.

20 Claims, 4 Drawing Sheets

SEMICONDUCTOR PACKAGE

RELATED APPLICATION

This application is based on and claims the benefit of U.S. Provisional Application Ser. No. 60/865,532, filed Nov. 13, 2006, entitled Dimpled Semiconductor Device Can to Receive Die With Conforming Apertures, to which a claim of priority is hereby made and the disclosure of which is incorporated by reference.

FIELD OF THE INVENTION

The present invention relates to chip-scale power semiconductor packages and methods of manufacturing chip-scale power semiconductor packages.

BACKGROUND AND SUMMARY OF THE INVENTION

Referring to FIGS. 1-4, a package 10 according to the prior art includes a conductive can 12, and a power semiconductor die 14. Can 12 is typically formed with an electrically conductive material such as copper or a copper-based alloy, and may be coated with silver, gold or the like. Die 14 may be a vertical conduction type power semiconductor MOSFET having its drain electrode 16 electrically and mechanically attached to an interior surface of can 12 by a conductive adhesive 18 such as solder or a conductive epoxy (e.g. silver epoxy). Source electrode 20, and gate electrode 22 of die 14 (which are disposed on a surface opposite to the drain electrode) each includes a solderable body which facilitates its direct connection to a respective conductive pad 24, 26 of a circuit board 28 by a conductive adhesive (e.g. solder or conductive epoxy) as illustrated by FIG. 4. Note that die 14 further includes passivation body 30 which partially covers source electrode 20 and gate electrode 22, but includes openings to allow access at least to the solderable portions thereof for electrical connection. Further note that in package 10 conductive can 12 includes web portion 13 (to which die 14 is electrically and mechanically connected), wall 15 surrounding web portion 13, and two oppositely disposed rails 32 extending from wall 15 each configured for connection to a respective conductive pad 34 on circuit board 28. Also, note that die 14 is spaced from wall 13 of can 12; i.e. wall 13 surrounds die 14. Thus, a moat 36 is present between die 14 and wall 13.

In a package according to the prior art, source electrode 20, and gate electrode 22 are soldered down by the user. Specifically, the user applies solder to, for example, the pads of a circuit board, and the electrodes of the die are attached to the pads by the solder so placed.

A package as described above is disclosed in U.S. Pat. No. 6,624,522.

In a package, according to the prior art, reducing the thickness of the die results in the reduction of Rdson and improved thermal performance as the active area of the die becomes closer to the can.

However, reduction of the thickness presents challenges in wafer handling, back end packaging and particularly die attach processes. For example, as the die thickness is reduced, the die attach fillet 37 height either requires reduction, or, if kept the same, the die attach gets closer to the front side of the die. Reducing the height of the die attach fillet decreases the strength of the die attach joint which may adversely affect reliability. FIG. 5, in which like numerals identify like features, illustrates a package that uses a die with etched apertures to create an assembly with performance close to that of a thin die package but with the ease of the assembly of a thicker die.

A semiconductor package according to the present invention includes a conductive clip having an interior surface that includes a plurality of spaced raised portions, a semiconductor device having a first major surface that includes a plurality of spaced depressions each receiving one of the raised portions in the interior thereof, and a conductive adhesive disposed between each raised portion and a respective interior surface of a depression.

Other features and advantages of the present invention will become apparent from the following description of the invention which refers to the accompanying drawings.

DETAILED DESCRIPTION OF THE FIGURES

Figure 6A:
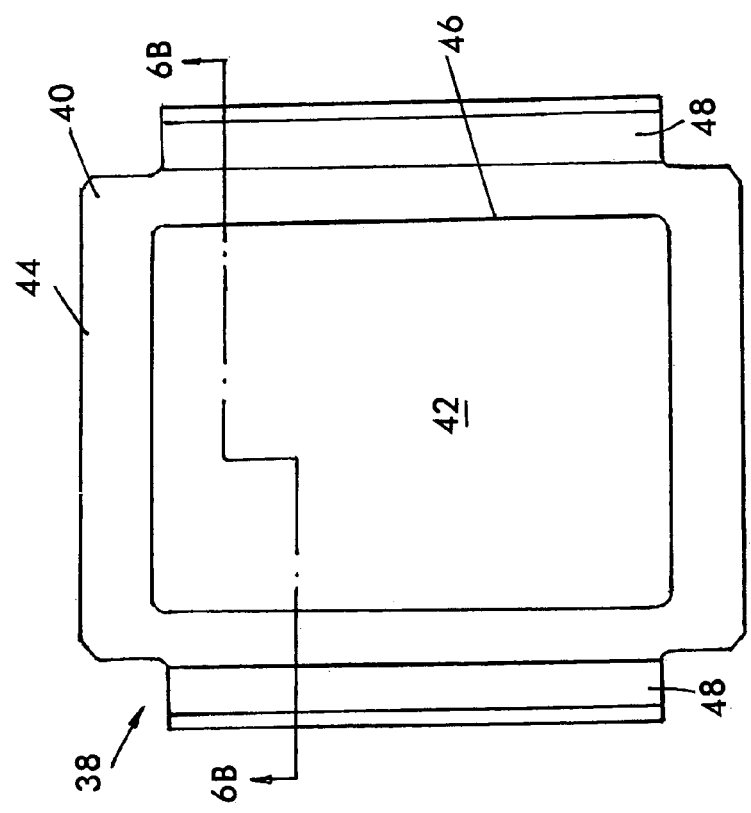
FIG. 6A illustrates a top plan view of a package according to the present invention.
Figure 6B:
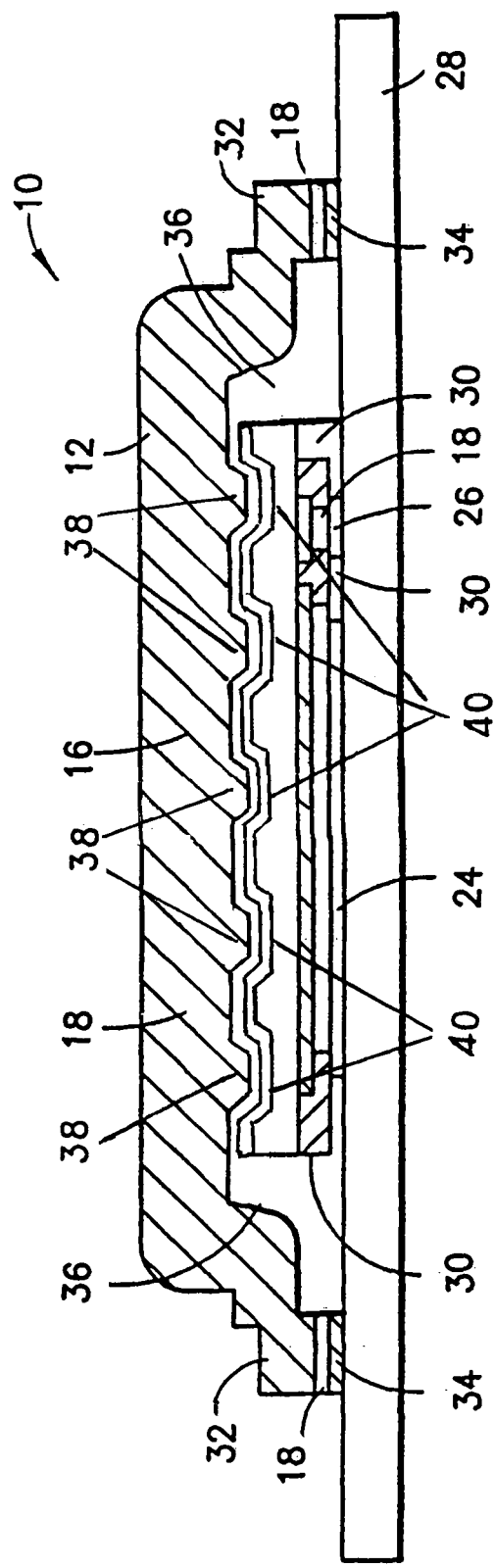
FIG. 6B illustrates a cross-sectional view of the package of FIG. 6A along lines 6B-6B viewed in the direction of the arrows as assembled onto a circuit board.

Referring to FIGS. 6A and 6B, a package according to the present invention includes a conductive clip, e.g. can 12, and a power semiconductor die 14. Can 12 is typically formed with an electrically conductive material such as copper or a copper-based alloy, and may be plated with silver, gold or the like. Die 14 may be a vertical conduction type power semiconductor MOSFET having its drain electrode 16 electrically and mechanically attached to an interior surface of can 12 by a conductive adhesive 18 such as solder or a conductive epoxy (e.g. silver epoxy). Source electrode 20, and gate electrode 22 of die 14 (which are disposed on a surface opposite to the drain electrode) are rendered flip-chip mountable. Thus, each electrode 20, 22 includes a solderable body which facilitates its direct connection to a respective conductive pad 24, 26 of a circuit board 28 by a conductive adhesive (e.g. solder or conductive epoxy) as illustrated by FIG. 6B. Note that die 14 further includes passivation body 30 which partially covers source electrode 20 and gate electrode 22, but includes openings to allow access at least to the solderable portions thereof for electrical connection. Further note that in a package according to the present invention conductive can 12 includes web portion 13 (to which die 14 is electrically and mechanically connected), wall 15 surrounding web portion 13, and two oppositely disposed rails 32 extending from wall 15 each configured for connection to a respective conductive pad 34 on circuit board 28. Also, note that die 14 is spaced from wall 13 of can 12; i.e. wall 13 surrounds die 14. Thus, a moat 36 is present between die 14 and wall 13.

According to one aspect of the present invention, the interior surface of can 12 includes a plurality of spaced raised portions 38 (e.g. mesas, or projections), and drain side of die 14 includes a plurality of spaced depressions 40 each receiving in the interior thereof a respective raised portion 38. A conductive adhesive 18 (e.g. solder or a conductive epoxy) is disposed between each raised portion 38 and an interior of a depression 40 in which the raised portion is received.

Raised portions 38 are created during the leadframe manufacturing process. They may be formed by chemically etching sheet copper prior to stamping the can shape, or by punching or coining operations prior to stamping the can shape.

A package according to the present invention has several advantages:

The profiled surface of the can that includes the raised portions 38 is closer to the rear of the die can improve device Rdson because the current flowing from the die to the can would traverse through a smaller thickness of conductive adhesive, which is less electrically conductive than the can material (e.g. copper).

Figure 1:
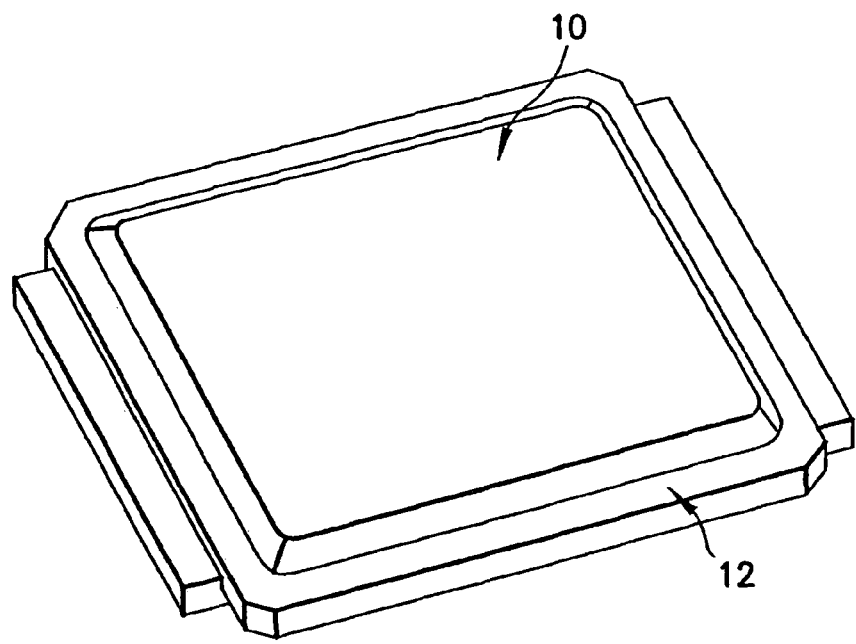
FIG. 1 is a perspective view of a package according to prior art.
Figure 2:
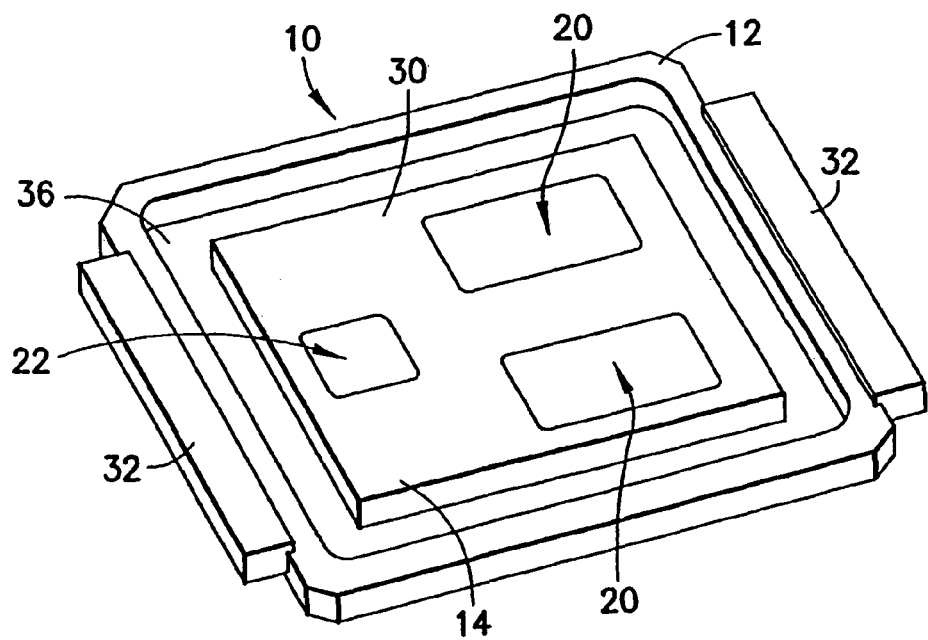
FIG. 2 is another perspective view of the package of FIG. 1.
Figure 3:
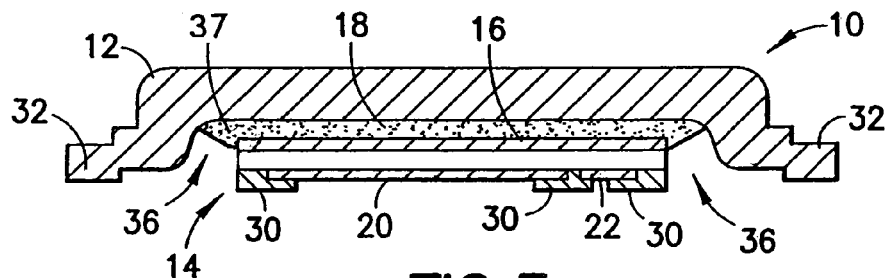
FIG. 3 is a cross-sectional view of the package of FIG. 1 along line 3-3 in FIG. 2.
Figure 4:
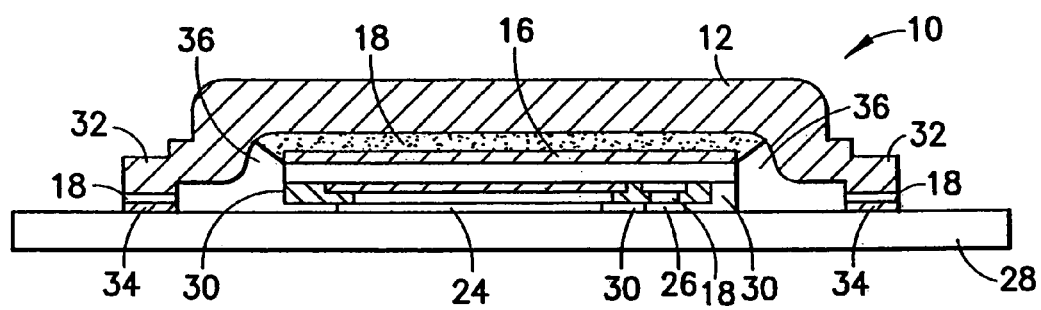
FIG. 4 shows the package of FIG. 1 as assembled on a circuit board.
Figure 5:
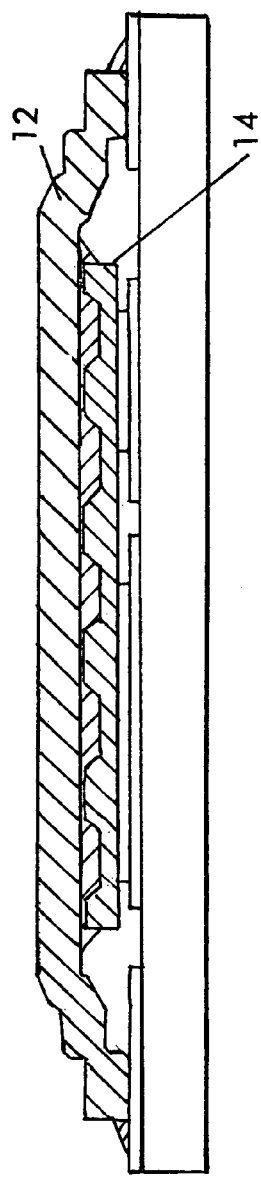
FIG. 5 illustrates a cross-sectional view of a package according to related art.

There can be improved thermal conduction from the rear surface of the die to the can because the can surface area is increased and is in closer proximity to the die surface. When compared to the related art package (FIG. 5) that includes for example a 200 µm die with etched apertures the heat flux travels through less conductive adhesive (or more copper) which reduces the thermal resistance.

The die will self align to the can thus improving die positional and rotational tolerance.

A package according to the present invention is may also be applied to more conventional packages that house die with pre-etched apertures. These packages may include the TO-220/D2PAK, TO-220, MLP or TO-247.

It should be noted that the present invention is not limited to MOSFETs, but other devices such as diodes or IGBTs may be used without deviating from the scope and the spirit of the present invention.

Although the present invention has been described in relation to particular embodiments thereof, many other variations and modifications and other uses will become apparent to those skilled in the art.

What is claimed is:

1. A semiconductor package comprising;
a conductive clip having an interior surface that includes spaced raised portions, wherein said spaced raised portions are structurally integral to and structurally continuous with said conductive clip so as to be part of said conductive clip;
a semiconductor device including a semiconductor die having a first major surface that includes a plurality of spaced depressions traversing said semiconductor die;
an electrode on said first major surface, said electrode lining said first major surface without filling said depressions entirely to provide space in each said depression in which at least a respective one of said spaced raised portions is received;
a conductive adhesive that extends into said depressions and along said spaced raised portions and is disposed between and is in continuous contact with said spaced raised portions and said electrode on said first surface of said semiconductor die to electrically connect said semiconductor die to said conductive clip through said electrode.

2. The semiconductor package of claim 1, wherein said semiconductor device further comprises a second major surface opposite said first major surface having at least one electrode configured for flip-chip mounting.

3. The semiconductor package of claim 2, wherein said one electrode is solderable.

4. The semiconductor package of claim 2, further comprising another electrode configured for flip-chip mounting disposed adjacent said one electrode.

5. The semiconductor package of claim 4, wherein said another electrode is solderable.

6. The semiconductor package of claim 4, further comprising a passivation body over said second major surface of said semiconductor device, said passivation body including an opening over said one electrode, and another opening over said another electrode.

7. The semiconductor package of claim 6, wherein said one electrode is a source electrode and said another electrode is a gate electrode of a power MOSFET.

8. The semiconductor package of claim 2, further comprising a passivation body over said second major surface of said semiconductor device, said passivation body including an opening over said one electrode.

9. The semiconductor package of claim 1, wherein said conductive clip is can-shaped.

10. The semiconductor package of claim 1, wherein said conductive clip is comprised of copper.

11. The semiconductor package of claim 1, wherein said conductive clip is plated with a metallic body.

12. The semiconductor package of claim 11, wherein said metallic body is comprised of silver.

13. The semiconductor package of claim 1, wherein said semiconductor device is a power MOSFET.

14. The semiconductor package of claim 1, wherein said semiconductor device is a diode.

15. The semiconductor package of claim 1, wherein said semiconductor device is an IGBT.

16. The semiconductor package of claim 1, wherein each of said spaced raised portions are defined by etched, punched, or coined portions of said conductive clip.

17. A semiconductor package comprising;
a can-shaped conductive clip having an interior surface that includes spaced raised portions, wherein said spaced raised portions are structurally integral to and structurally continuous with said conductive clip so as to be part of said conductive clip;
a semiconductor device including a semiconductor die having a first major surface that includes a plurality of spaced depressions traversing of said semiconductor die, said semiconductor device surrounded by said conductive clip with an empty moat in-between;
an electrode on said first major surface, said electrode lining said first major surface without filling said depressions entirely to provide space in each said depression in which at least a respective one of said spaced raised portions is received;
a conductive adhesive that extends into said depressions and along said spaced raised portions and is disposed between and is in continuous contact with said spaced raised portions and said electrode on said first surface of said semiconductor die to electrically connect said semiconductor die to said conductive clip through said electrode.

18. The semiconductor package of claim 17, wherein said conductive clip is comprised of copper.

19. The semiconductor package of claim 17, wherein said semiconductor device further comprises a second major surface opposite said first major surface having at least one electrode configured for flip-chip mounting.

20. The semiconductor package of claim 17, wherein said semiconductor device is a power MOSFET.

* * * * *